United States Patent
Min et al.

(10) Patent No.: US 9,324,683 B2
(45) Date of Patent: Apr. 26, 2016

(54) SEMICONDUCTOR PACKAGE AND METHOD OF MANUFACTURING THE SAME

(71) Applicant: Samsung Electronics Co., Ltd., Suwon-si, Gyeonggi-do (KR)

(72) Inventors: Tae-Hong Min, Yongin-si (KR); Young-Kun Jee, Suwon-si (KR); Tae-Je Cho, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/318,643

(22) Filed: Jun. 28, 2014

(65) Prior Publication Data

US 2015/0048493 A1 Feb. 19, 2015

(30) Foreign Application Priority Data

Aug. 13, 2013 (KR) ........................ 10-2013-0095965

(51) Int. Cl.
*H01L 21/00* (2006.01)
*H01L 23/00* (2006.01)
(Continued)

(52) U.S. Cl.
CPC .............. *H01L 24/83* (2013.01); *H01L 23/433* (2013.01); *H01L 23/4334* (2013.01); *H01L 24/81* (2013.01); *H01L 24/92* (2013.01); *H01L 24/95* (2013.01); *H01L 24/97* (2013.01); *H01L 25/0657* (2013.01); *H01L 25/50* (2013.01); *H01L 21/561* (2013.01); *H01L 23/3128* (2013.01); *H01L 23/49816* (2013.01); *H01L 23/49827* (2013.01); *H01L 24/05* (2013.01); *H01L 24/06* (2013.01); *H01L 24/13* (2013.01); *H01L 24/16* (2013.01); *H01L 24/29* (2013.01); *H01L 24/32* (2013.01); *H01L 24/73* (2013.01); *H01L 2224/0401* (2013.01); *H01L 2224/0557* (2013.01); *H01L 2224/05568* (2013.01); *H01L 2224/06181* (2013.01); *H01L 2224/131* (2013.01); *H01L 2224/16145* (2013.01); *H01L 2224/16148* (2013.01); *H01L 2224/16225* (2013.01); *H01L 2224/2732* (2013.01);
(Continued)

(58) Field of Classification Search
USPC ......................................................... 438/109
See application file for complete search history.

(56) References Cited

U.S. PATENT DOCUMENTS 5,883,430 A * 3/1999 Johnson .............. H01L 23/3218
257/706
6,486,562 B1 * 11/2002 Kato ...................... H01L 21/563
257/712

(Continued)

FOREIGN PATENT DOCUMENTS

KR         101069499 B1   9/2011
KR         20120005185 A  1/2012

*Primary Examiner* — Telly Green
(74) *Attorney, Agent, or Firm* — Renaissance IP Law Group LLP (57) ABSTRACT

In one embodiment, a semiconductor package includes a circuit substrate, a plurality of semiconductor chips stacked on the circuit substrate, insulating adhesive patterns interposed between the semiconductor chips, a heat slug provided on an uppermost semiconductor chip and adhered to the uppermost semiconductor chip by a heat dissipative adhesive pattern, and a mold structure provided on the circuit substrate to cover sidewalls of the semiconductor chips, the insulating adhesive patterns, the heat dissipative adhesive pattern and the heat slug. A failure of the semiconductor package during a manufacturing process of the mold structure may be reduced. The semiconductor package may therefore have good operating characteristics and reliability.

12 Claims, 6 Drawing Sheets

(51) Int. Cl.
*H01L 25/065* (2006.01)
*H01L 25/00* (2006.01)
*H01L 23/433* (2006.01)
*H01L 23/31* (2006.01)
*H01L 21/56* (2006.01)
*H01L 23/498* (2006.01)

(52) U.S. Cl.
CPC . *H01L2224/2919* (2013.01); *H01L 2224/2939* (2013.01); *H01L 2224/29294* (2013.01); *H01L 2224/32145* (2013.01); *H01L 2224/32245* (2013.01); *H01L 2224/73204* (2013.01); *H01L 2224/73253* (2013.01); *H01L 2224/81203* (2013.01); *H01L 2224/81815* (2013.01); *H01L 2224/81907* (2013.01); *H01L 2224/83005* (2013.01); *H01L 2224/83101* (2013.01); *H01L 2224/83192* (2013.01); *H01L 2224/83203* (2013.01); *H01L 2224/83907* (2013.01); *H01L 2224/9205* (2013.01); *H01L 2224/9211* (2013.01); *H01L 2224/9221* (2013.01); *H01L 2224/95* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2924/1431* (2013.01); *H01L 2924/1436* (2013.01); *H01L 2924/1437* (2013.01); *H01L 2924/1438* (2013.01); *H01L 2924/1579* (2013.01); *H01L 2924/15192* (2013.01); *H01L 2924/15311* (2013.01); *H01L 2924/181* (2013.01); *H01L 2924/3512* (2013.01)

(56) References Cited

U.S. PATENT DOCUMENTS

| | | | |
|---|---|---|---|
| 6,828,676 B2 | 12/2004 | Akai | |
| 7,598,121 B2 | 10/2009 | Kinoshita et al. | |
| 7,679,175 B2 | 3/2010 | Saeki | |
| 8,048,794 B2 | 11/2011 | Knickerbocker | |
| 8,310,046 B2 | 11/2012 | Baek et al. | |
| 8,377,745 B2 | 2/2013 | Shimada et al. | |
| 2002/0140108 A1* | 10/2002 | Johnson | H01L 21/563 257/778 |
| 2011/0147945 A1* | 6/2011 | Yoshida | H01L 21/561 257/774 |
| 2012/0020082 A1* | 1/2012 | Shinohara | F21K 9/135 362/235 |
| 2012/0098145 A1 | 4/2012 | Yoshida et al. | |
| 2012/0171814 A1* | 7/2012 | Choi | H01L 21/561 438/107 |
| 2013/0026643 A1 | 1/2013 | England et al. | |
| 2013/0078765 A1 | 3/2013 | Lin et al. | |
| 2013/0082372 A1 | 4/2013 | Lin et al. | |
| 2013/0082376 A1 | 4/2013 | Nagarkar et al. | |
| 2013/0082399 A1 | 4/2013 | Kim et al. | |
| 2013/0083473 A1 | 4/2013 | Mahran et al. | |
| 2013/0099388 A1 | 4/2013 | Kim et al. | |

\* cited by examiner

SEMICONDUCTOR PACKAGE AND METHOD OF MANUFACTURING THE SAME

CROSS-REFERENCE TO RELATED APPLICATION

This application claims priority under 35 USC §119 to Korean Patent Application No. 10-2013-0095965 filed on Aug. 13, 2013 in the Korean Intellectual Property Office (KIPO), the entire disclosure of which is incorporated herein by reference.

BACKGROUND

1. Field

Example embodiments relate to semiconductor packages and methods of manufacturing the same. More particularly, example embodiments relate to chip-stacked semiconductor packages and methods of manufacturing the same.

2. Description of the Related Art

The recent trend toward miniaturization of electronic products leads to the development of smaller, thinner and high-density semiconductor packages. Along with this trend, semiconductor packages having a chip-on-chip (COC) type are being actively developed. A current assembling process for forming the COC semiconductor package is, however, quite complicated.

SUMMARY

Some embodiments relate to a method of manufacturing a semiconductor package, which reduces a failure in a package assembly process and a semiconductor package which enables such a method.

According to example embodiments, a semiconductor package includes a circuit substrate, a plurality of semiconductor chips stacked on the circuit substrate, insulating adhesive patterns interposed between the semiconductor chips, a heat slug provided on an uppermost semiconductor chip and adhered to the uppermost semiconductor chip through a heat dissipative adhesive pattern, and a mold structure provided on the circuit substrate to cover sidewalls of the semiconductor chips, the insulating adhesive patterns, the heat dissipative adhesive pattern and the heat slug.

In example embodiments, at least one of the semiconductor chips may include a through-silicon via (TSV).

In example embodiments, the heat slug may cover the uppermost semiconductor chip, and a top surface area of the heat slug may be greater than a top surface area of the uppermost semiconductor chip.

According to example embodiments, there is provided a method of manufacturing a semiconductor package. Semiconductor chips are preliminarily stacked on a circuit substrate by using insulating adhesive patterns to form a plurality of preliminarily stacked chips. Each preliminarily stacked chip includes the semiconductor chips with the insulating adhesive patterns interposed therebetween. Heat slugs are formed on the preliminarily stacked chips by using heat dissipative adhesive patterns, respectively, and the heat slugs are thermally pressurized to bond the underlying semiconductor chips to each other and to form a plurality of stacked chips. A mold material is injected between the stacked chips on the circuit substrate to form the mold structure on sidewalls of the semiconductor chips, on sidewalls of the insulating adhesive patterns, on sidewalls of the heat dissipative adhesive patterns and on sidewalls of the heat slugs.

In example embodiments, when the preliminarily stacked chips are formed, i) first semiconductor chips may be bonded to the circuit substrate by a reflow process. ii) First insulating adhesive patterns may be formed on bottom surfaces of second semiconductor chips, respectively. iii) The second semiconductor chips may be aligned with the first semiconductor chips, respectively, and the first and second semiconductor chips may be preliminarily bonded to each other at a first temperature and under a first pressure.

In example embodiments, the steps of ii) and iii) may be further performed repeatedly for third to n-th semiconductor chips (where n is an integer equal to or greater than 3).

In example embodiments, the first temperature may be less than a melting point of a connection structure included in each semiconductor chip.

In example embodiments, thermally pressurizing the heat slugs may be performed at a second temperature greater than the first temperature and under a second pressure greater than the first pressure.

In example embodiments, the second pressure may be within a range of about 3 times to about 10 times the first pressure.

In example embodiments, the second temperature is greater than a melting point of a connection member included in the semiconductor chip.

In example embodiments, a top surface area of each heat slug may be greater than a top surface area of an uppermost semiconductor chip, and each heat slug may cover the uppermost semiconductor chip.

In example embodiments, when the heat slugs are formed on the preliminarily stacked chips, a heat dissipative plate and a heat dissipative adhesive film may be formed on a carrier. The heat dissipative plate and the heat dissipative adhesive film may be patterned to form the heat slugs and the heat dissipative adhesive patterns. The heat dissipative adhesive patterns may be aligned with the preliminarily stacked chips, respectively. The heat slugs may be thermally pressurized.

In example embodiments, at least one of the semiconductor chips may include a through silicon via.

In example embodiments, the insulating adhesive pattern may include a different material from that of the heat dissipative adhesive pattern.

In example embodiments, connection terminals may be further bonded to a bottom surface of the circuit substrate including the mold structure. The mold structure and the circuit substrate may be diced to form separated semiconductor packages.

According to example embodiments, the mold structure of a semiconductor package may cover the sidewall of the heat slug. Before the mold structure is formed, the heat slug having an enough area and thickness may be formed. A failure of the semiconductor package during a manufacturing process of the mold structure may be reduced. The semiconductor package may have good operating characteristics and reliability.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments as described herein.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
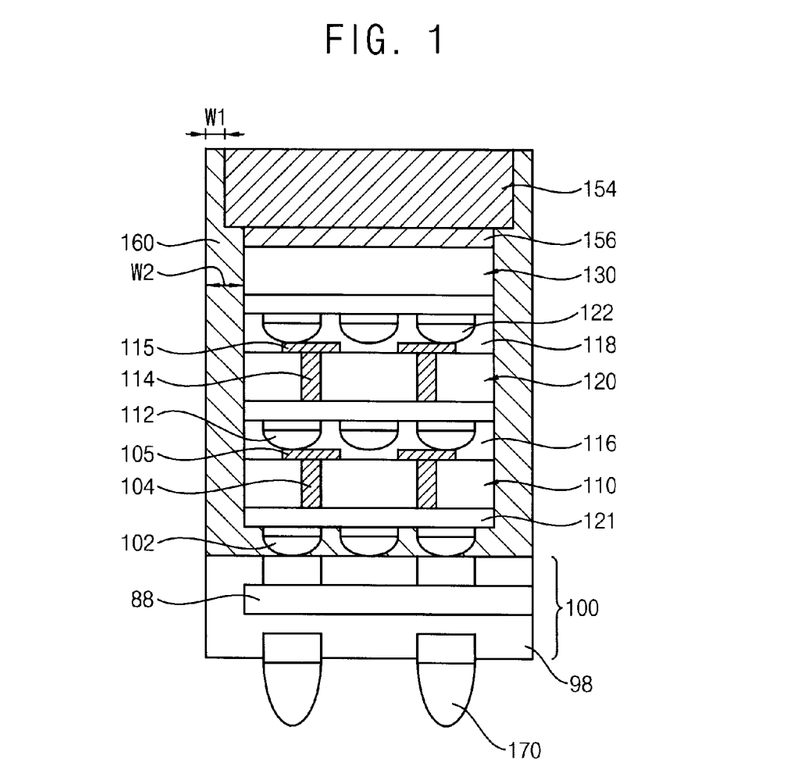
FIG. 1 is a cross-sectional view illustrating a semiconductor package in accordance with one embodiment.

FIG. 1 is a cross-sectional view illustrating a semiconductor package in accordance with example embodiments.

Referring to FIG. 1, a semiconductor package 500 may include a circuit substrate 100, semiconductor chips 110, 120 and 130 sequentially stacked on the circuit substrate 100, and insulating adhesive patterns 116 and 118 interposed between the semiconductor chips 110, 120 and 130. A heat slug 154 may be attached to an uppermost semiconductor chip 130 using a heat dissipative adhesive pattern 156. The semiconductor package 500 may further include a mold structure 160 covering sidewalls of the semiconductor chips 110, 120 and 130, sidewalls of the insulating adhesive patterns 116 and 118, sidewalls of the heat dissipative adhesive pattern 156 and sidewalls of the heat slug 154.

The number of the stacked semiconductor chips 110, 120 and 130 on the circuit substrate 100 may not be limited thereto. Hereinafter, the semiconductor package having three semiconductor chips 110, 120 and 130 stacked thereon will be explained. As discussed, first to third semiconductor chips 110, 120 and 130 may be sequentially stacked on the circuit substrate 100. The third semiconductor chip 130 may be an uppermost semiconductor chip.

The circuit substrate 100 may include an insulating and heat-resistive material. The circuit substrate 100 may include a planar body 98 having a predetermined strength, and a plurality of circuit patterns or conductive traces 88 arranged in the body 98. The circuit patterns may be electrically connected to exposed connection members (not shown) on top and bottom surfaces of the body 98. External connection terminals 170 and the semiconductor chips 110, 120 and 130 may be electrically connected to each other through the connection members and the circuit patterns 88. The connection members on a top surface of the body 98 may be electrically connected to a first connection structure 102 formed on a bottom surface of the first semiconductor chip 110. The connection members on the bottom surface of the body 98 may be electrically connected to the connection terminals 170. The external connection terminals 170 may include a solder ball.

In some embodiments, the exposed connection members may not be needed. In this case, the first connection structure 102 may be connected to the external connection terminals 170 through the plurality of circuit patterns or conductive traces 88 arranged in the body 98 without the exposed connection members.

The body 98 may include a thermosetting resin plate such as an epoxy resin substrate, a polyimide substrate, etc., or a plate to which a heat-resistant organic film such as a liquid crystal polyester film, a polyimide film, etc. adhered. The circuit patterns 88 may include a power wire for supplying a power and a signal wire for grounding and signal transmission. The wires may be separated by a plurality of insulation interlayers (not illustrated). The circuit substrate 100 may include a printed circuit board (PCB) in which the circuit patterns are formed by a printing process.

A stacked chip may include the first to third semiconductor chips 110, 120 and 130. The stacked chip may include a plurality of memory devices. The memory devices and logic devices may be stacked in the stacked chip. The memory devices may include DRAM, SRAM, flash devices, etc. The first to third semiconductor chips 110, 120 and 130 may be separated by a sawing process and processed using a wafer-level packaging process.

The first and second semiconductor chips 110 and 120 (but not the uppermost semiconductor chip 130) may include first and second through silicon vias (TSV) 104 and 114, respectively. The first and second semiconductor chips 110 and 120 may include first and second pads 105 and 115 contacting the first and second TSV 104 and 114, respectively. The first to third semiconductor chips 110, 120 and 130 may be electrically connected to each other in a vertical direction. First to third connection structures 102, 112 and 122 may be provided on lower surfaces of the first and third semiconductor chips 110, 120 and 130, respectively. The first to third connection structures 102, 112 and 122 may each include a solder bump. The second and third connection structures 112 and 122 may be electrically connected to the first and second TSV 104 and 114, respectively, through corresponding ones of the first and second pads 105 and 115, respectively.

In some embodiments, a backside dielectric layer 121 may be formed on a backside of the first semiconductor chip 110 (and the second and third semiconductor chips 120, 130.) In this case, various circuitries formed in the first semiconductor chip 110 are electrically coupled to the first connection structure 102 although it is not specifically illustrated. This is also applicable to other semiconductor chips.

The first semiconductor chip 110 may be bonded to the circuit substrate 100. In particular, the circuit substrate 100 and the first connection structure 102 provided on the lower surface of the first semiconductor chip 110 may be bonded to each other by a reflow process. The circuit substrate 100 and the first connection structure 102 may be thermally coupled to each other in the reflow process. An insulating adhesive film may not be provided in a gap between the circuit substrate 100 and the first semiconductor chip 110.

The second semiconductor chip 120 may be coupled to the first semiconductor chip 110. A first insulating adhesive pattern 116 may be interposed between the first and second semiconductor chips 110 and 120. The first semiconductor chip 110 and the second connection structure 112 provided on the lower surface of the second semiconductor chip 120 may be bonded to each other by the first insulating adhesive pattern 116. The first insulating adhesive pattern 116 may bond upper and lower semiconductor chips together by heat and pressure. The first insulating adhesive pattern 116 may include an insulation material filling a gap between the upper and lower semiconductor chips. The first insulating adhesive pattern 116 may include an adhesive resin compound such as non-conductive film (NCF). The first insulating adhesive pattern 116 may include non-conductive paste (NCP). However, the first insulating adhesive pattern 116 may not be limited herein.

The third semiconductor chip 130 may be bonded to the second semiconductor chip 120. A second insulating adhesive pattern 118 may be interposed between the second and third semiconductor chips 120 and 130. The second insulating adhesive pattern 118 may bond the second semiconductor chip 120 to the third connection structure 122 provided on the lower surface of the third semiconductor chip 130. The second insulating adhesive pattern 118 may bond upper and lower semiconductor chips together by heat and pressure. The second insulating adhesive pattern 118 may include an insulation material filling a gap between the upper and lower semiconductor chips. The second insulating adhesive pattern 118 may include substantially the same material as that included in the first insulating adhesive pattern 116.

The first to third semiconductor chips 110, 120 and 130 may have first to third thicknesses, respectively. For example, the first and second thicknesses may be within about tens of micrometers. The first and second depths may be substantially the same as or different from each other.

The uppermost semiconductor chip, the third semiconductor chip 130, may have a third thickness within a range of between about the first or second thickness to a thickness that is approximately twice that of the thickness of the first or second thickness. The third thickness may be substantially the same as or greater than the first or second thickness.

The heat slug 154 may be provided on the uppermost semiconductor chip 130. The heat dissipative adhesive pattern 156 may be provided between the uppermost semiconductor chip 130 and the heat slug 154.

The heat dissipative adhesive pattern 156 may bond the uppermost semiconductor chip 130 and the heat slug 154 to each other. The heat dissipative adhesive pattern 156 may transfer heat generated during operation of the semiconductor chips 110, 120 and 130 to the heat slug 154. The heat dissipative adhesive pattern 156 may include a thermal interface material (TIM). The heat dissipative adhesive pattern 156 may include a different material from those of the first and second insulating adhesive patterns 116 and 118. The heat dissipative adhesive pattern 156 may include an adhesive material to bond the uppermost semiconductor chip 130 and the heat slug to each other.

The heat slug 154 may cover a top surface of the uppermost semiconductor chip 130 and extend beyond a sidewall of the uppermost semiconductor chip 130 in a horizontal direction. In example embodiments, the heat slug 154 may extend beyond the sidewall of the uppermost semiconductor chip 130 in about several micrometers. A top surface area of the heat slug 154 may be greater than a top surface area of the uppermost semiconductor chip 130. However, a top surface area of the heat slug 154 may be less than a top surface area of the circuit substrate 100 included in an individual semiconductor package.

The heat slug 154 may have a fourth thickness greater than the third thickness of the uppermost semiconductor chip 130. The heat slug 154 may include a metal having heat conductivity. For example, the heat slug 154 may include copper.

The mold structure 160 may protect the semiconductor chips 110, 120 and 130 from an external environment. The mold structure 160 may stably affix the semiconductor chips 110, 120 and 130 to the circuit substrate 100. The mold structure 160 may include resin. For example, the mold structure 160 may include an epoxy resin, a thermosetting resin, a silicate, a catalyst, or a coloring paint. In example embodiments, the mold structure 160 may include an epoxy resin such as epoxy molding compound (EMC).

In some embodiments, an insulating adhesive pattern may not be provided in a gap between the circuit substrate 100 and the first semiconductor chip 110. The gap between the circuit substrate 100 and the first semiconductor chip 110 may be filled with the mold structure 160.

The first and second insulating adhesive patterns 116 and 118 may be provided in gaps between the first and second semiconductor chips 110 and 120 and between the second and third semiconductor chips 120 and 130, respectively. The heat dissipative adhesive pattern 156 may be provided in a gap between the third semiconductor chip 130 and the heat slug 154. The mold structure 160 may be provided on sidewalls of the first to third semiconductor chips 110, 120 and 130, on sidewalls of the first and second insulating adhesive patterns 116 and 118, and on sidewalls of the heat dissipative adhesive pattern 156.

The top surface area of the heat slug 154 may be greater than the top surface area of the third semiconductor chip 130. A first width w1 of the mold structure 160 provided on the sidewall of the heat slug 154 may be less than a second width w2 of the mold structure 160 provided on the sidewall of the third semiconductor chip 130. The mold structure 160 may not be provided on the top surface of the heat slug 154.

In some embodiments, the mold structure 160 of a semiconductor package may cover the sidewall of the heat slug 154. Before the mold structure 160 is formed, the heat slug 154 having a sufficient area and thickness may be formed. Accordingly, the failure of the semiconductor package during a manufacturing process of the mold structure 160 may be reduced. As a result, the semiconductor package may have good operating characteristics and reliability.

FIGS. 2 to 11 are cross-sectional views illustrating various stages of a method of manufacturing a semiconductor package in accordance with example embodiments.

Figure 2:
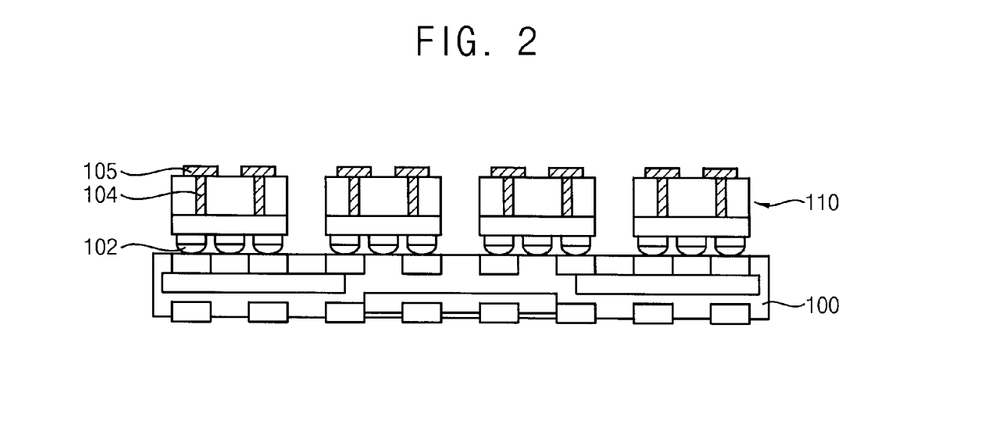
FIGS. 2 to 11 are cross-sectional views illustrating stages of a method of manufacturing a semiconductor package in accordance with example embodiments.

Referring to FIG. 2, first semiconductor chips 110 may be mounted on a circuit substrate 100. The first semiconductor chips 110 may be evenly arranged on the circuit substrate 100 to permit a sawing process to be performed to form a diced package.

First connection structures 102 on the bottom surface of the first semiconductor chips 110 may be aligned with suitable portions of the circuit substrate 100 to mount the first semiconductor chips 110 on the circuit substrate 100. A reflow process may be performed at a melting temperature of the first connection structures 102 to connect the first semiconductor chips 110 and the circuit substrate 100 to each other. In the reflow process, the first semiconductor chips 110 may not be pressurized. An additional adhesive film may not be provided between the circuit substrate 100 and the first semiconductor chips 110.

Figure 3:
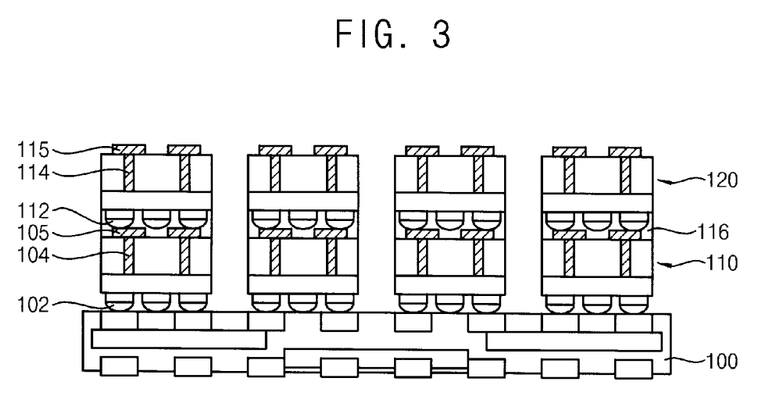

Referring to FIG. 3, first insulating adhesive patterns 116 may be formed on bottom surfaces of second semiconductor chips 120. The second semiconductor chips 120 including the first insulating adhesive patterns 116 may be adhered to a top surface of the first semiconductor chips 110, respectively, as a first preliminarily attachment process. Second connection structures 112 on the bottom surface of the second semiconductor chips 120 may be preliminarily adhered to 1st pads 105 on the top surface of the first semiconductor chip 110, respectively. The first attachment process may be performed at a first temperature and a first pressure.

At the first temperature, the second connection structures 112 may be melted. In example embodiments, the first temperature may be within a range of about 50 degrees Celsius to about 150 degrees Celsius. More preferably, the first temperature may be within a range of about 50 degrees Celsius to about 100 degrees Celsius. The first pressure may be less than a pressure desired to bond the first semiconductor chips 110. In example embodiments, the first pressure may be within a range of about one-third to about one-tenth of the pressure desired to bond the first semiconductor chips 110.

By the first preliminarily attachment process, the first and second semiconductor chips 110 and 120 may be sufficiently affixed to each other to prevent changes with respect to their positions in subsequent processes. At this stage, the first and second semiconductor chips 110 and 120 may not be permanently adhered to each other. A gap between the first and second semiconductor chips 110 and 120, excluding contacting portions of the first and second semiconductor chips 110 and 120, may be filled with the first insulating adhesive patterns 116.

The first preliminarily attachment process may be performed at a low temperature and a low pressure. In the first preliminarily attachment process, the first insulating adhesive patterns 116 may not overflow to sidewalls or upper and lower portions of the first and second semiconductor chips 110. As a result, the overflow of the first insulating adhesive patterns 116 that could result in a process failure may be reduced.

Figure 4:
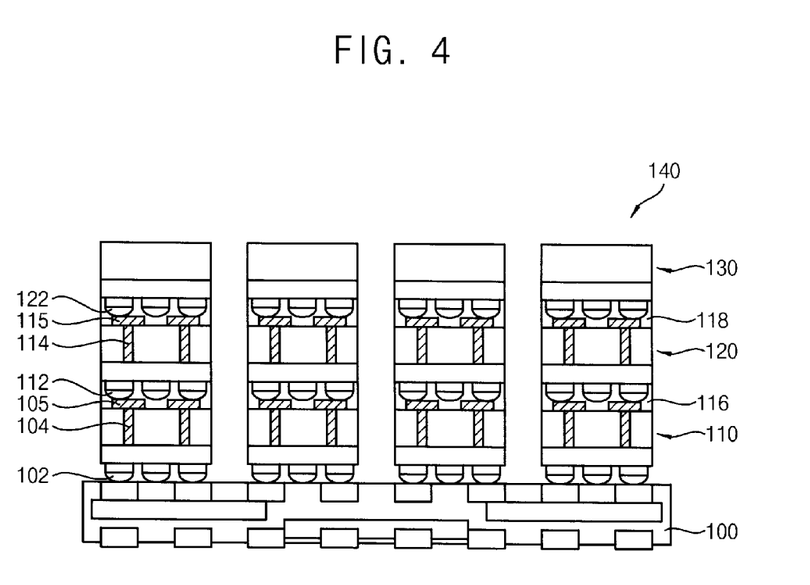

Referring to FIG. 4, second insulating adhesive patterns 118 may be formed on bottom surfaces of third semiconductor chips 130. The second insulating adhesive patterns 118 may include the same material as that of the first insulating adhesive patterns 116.

The third semiconductor chips 130, the uppermost semiconductor chips, may have a thickness within a range of about a thickness of the first or second semiconductor chip 110 and 120, the lower chips, to about twice the thickness of the first or second semiconductor chip 110 and 120. The third semiconductor chips 130 may have a thickness less than about tens of micrometers. The third semiconductor chips 130 may have a thickness equal to or greater than that of the first or second semiconductor chip 110 and 120.

The third semiconductor chips 130 including the second insulating adhesive patterns 118 may be preliminarily adhered to top surfaces of the second semiconductor chips 120, respectively, during a second preliminarily attachment process. The second preliminarily attachment process may be substantially the same as the first preliminarily attachment process. The second preliminarily attachment process may be performed at the first temperature and the first pressure.

In the second preliminarily attachment process, the second and third semiconductor chips 120 and 130 may be sufficiently affixed to each other to prevent a change to their positions in subsequent processes. At this stage, the second and third semiconductor chips 120 and 130 may not be permanently adhered to each other. In the second preliminarily attachment process, the second insulating adhesive patterns 118 may not overflow, which can lead to a process failure.

By performing the above processes, preliminarily stacked chips 140 including a plurality of the semiconductor chips stacked on the circuit substrate 100, respectively, may be formed.

Figure 5:
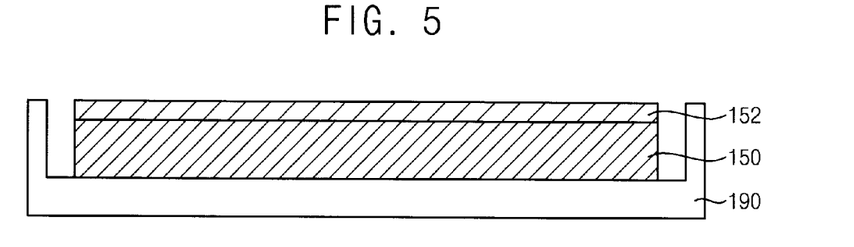

Referring to FIG. 5, a carrier 190 supporting a heat dissipative plate 150 may be provided. The carrier 190 may have a ring shape. A tape to fix the heat dissipative plate 150 may be formed in the ring.

The heat dissipative plate 150 may be adhered to the tape of the carrier 190, and a heat dissipative adhesive film 152 may be formed on the heat dissipative plate 150. The heat dissipative plate 150 may have a planar shape. The heat dissipative plate 150 may have a thickness greater than that of the third semiconductor chip 130.

Figure 6:
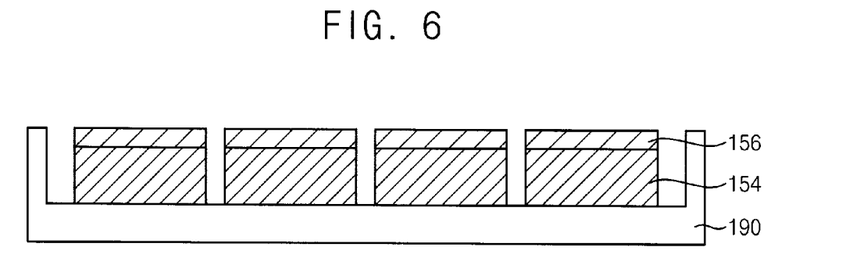

Referring to FIG. 6, a sawing process may be performed on the stacked structure including the heat dissipative plate 150 and the heat dissipative adhesive film 152 to form separated heat slugs 154 and heat dissipative adhesive patterns 156. The heat slugs 154 and the heat dissipative adhesive patterns 156 may be arranged on a corresponding one of the preliminarily stacked chips 140.

The heat slug 154 and the heat dissipative adhesive pattern 156 may cover the third semiconductor chips 130, i.e., the uppermost semiconductor chips. The heat slug 154 and the heat dissipative adhesive pattern 156 may extend beyond sidewalls of the third semiconductor chips 130 in a horizontal direction.

Figure 7:
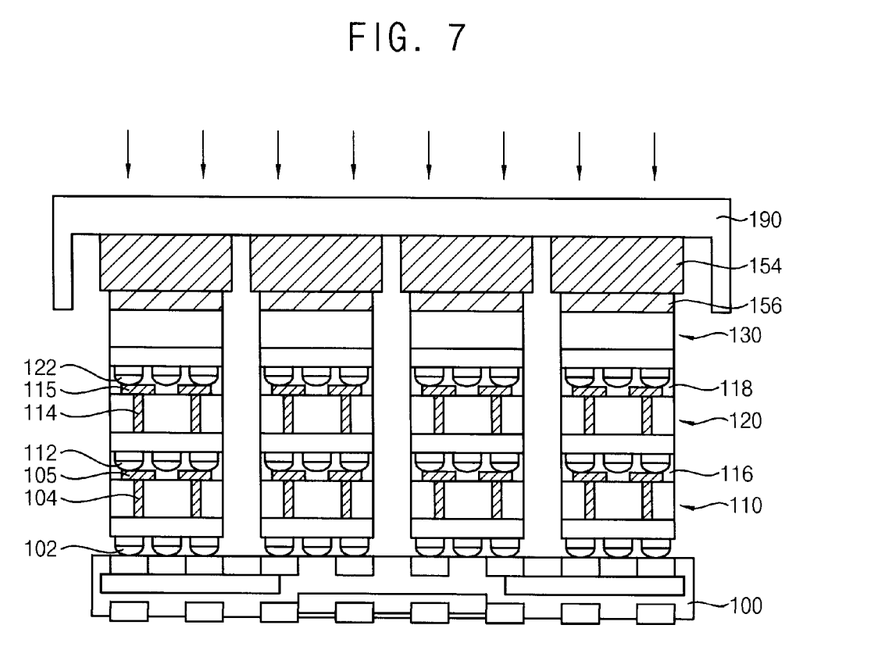
Figure 8:
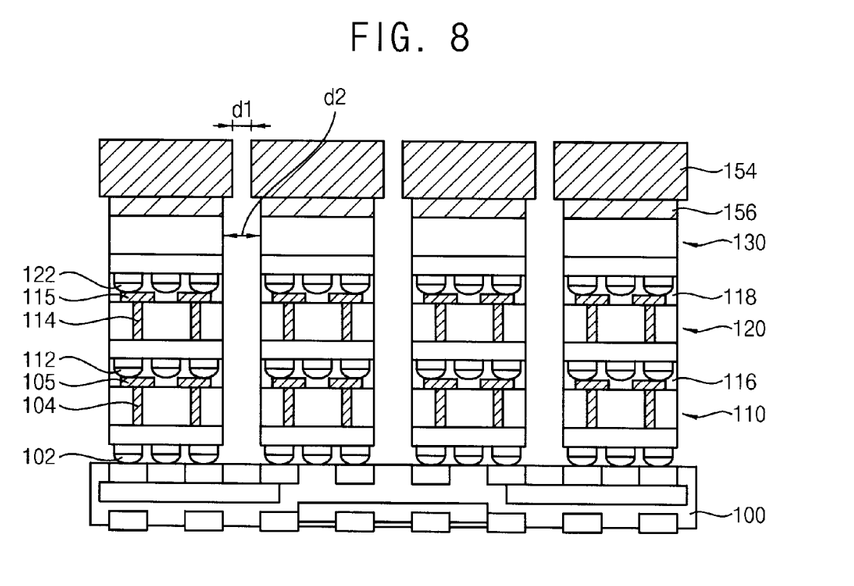

Referring to FIG. 7, the heat dissipative adhesive pattern 156 and top surfaces of the third semiconductor chips 130 may be in contact with each other. The heat slug 145 and the third semiconductor chips 130 may be bonded to each other at a second temperature and a second pressure. As is illustrated in FIG. 8, the carrier 190 may be removed.

Second and third connection structures 112 and 122, disposed on the bottom surfaces of the second and third semiconductor chips 120 and 130, may be partially melted. The second temperature may be greater than the first temperature. In an example embodiment, the second temperature may be within a range of about 200 degrees Celsius to about 300 degrees Celsius. More preferably, the second temperature may be within a range of about 220 degrees Celsius to about 250 degrees Celsius. The second pressure may be a pressure sufficient to permanently bond the preliminarily attached semiconductor chips. The second pressure may be greater than the first pressure. In some embodiments, the second pressure may be within a range of about 3 times to about 10 times the first pressure.

The above thermal, pressurized bonding processes may be performed to bond the heat slug 154 and the third semiconductor chips 130 to each other. The preliminarily-adhered first and second semiconductor chips 110 and 120, and the preliminarily-adhered second and third semiconductor chips 120 and 130 may be bonded to each other at the second temperature and the second pressure. Accordingly, each stacked chip 140 may be formed to include the first to third semiconductor chips 110, 120 and 130, stacked on the circuit substrate 100.

Each heat slug 154 may cover substantially the entire top surface of the third semiconductor chip 130. Sidewalls of each heat slug 154 may extend beyond sidewalls of the third semiconductor chip 130 in the horizontal direction. A first gap d1, representing a horizontal gap between adjacent ones of the heat slugs 154, may be less than a second gap d2, representing a horizontal gap between adjacent ones of the third semiconductor chips 130.

The heat slug 154 may have a thickness greater than that of the third semiconductor chip 130. As the heat slug 154 is provided, a sufficient thickness may be provided from a bottom surface of the third semiconductor chip 130 to a top surface of the heat slug 154.

By increasing the thickness between the bottom surface of the third semiconductor chip 130 and the top surface of the heat slug 154, the first and second insulating adhesive patterns 116 and 118 may not overflow to the top surface of the heat slug 154 as a result of the strong pressure during the thermal bonding process. Because the first gap d1 between the heat slugs 154 is small, the first and second insulating adhesive patterns 116 and 118 may not overflow to the top surface of the heat slug 154.

According to principles of the inventive concepts, a process failure due to the overflow of the first and second insulating adhesive patterns 116 and 118 may be reduced. For example, if the adhesive film is overflowed and consolidated on the top surface of the heat slug 154, cracks may occur in subsequent processes.

Figure 9:
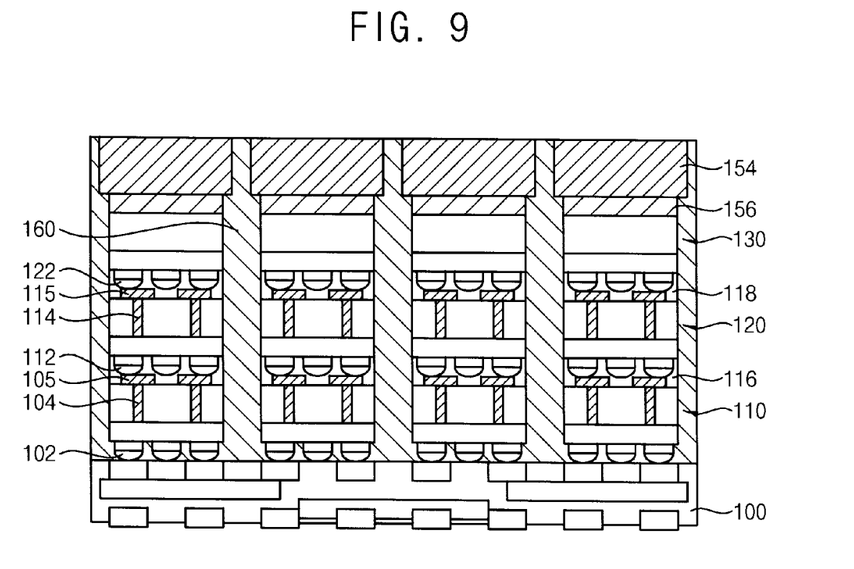

Referring to FIG. 9, a mold material may be inserted in a gap between the stacked chips 140. The mold material may be pressurized to form a mold structure 160. Lower stacked chips may be pressurized also. For a heat dissipative effect, the mold structure 160 may not be provided on the heat slug 154.

An insulating adhesive pattern may not be provided in gaps between the circuit substrate 100 and the first semiconductor chips 110. The mold structure 160 may be provided in gaps between the circuit substrate 100 and the first semiconductor chips 110. The first and second insulating adhesive patterns 116 and 118 may be provided in a gap between the first and second semiconductor chips 110 and 120, and a gap between the second and the third semiconductor chips 120 and 130. The heat dissipative adhesive pattern 156 may be provided between the third semiconductor chip 130 and the heat slug 154.

The mold structure 160 may be formed on sidewalls of the first and second insulating adhesive pattern 116 and 118, and on sidewalls of the heat dissipative adhesive pattern 156. The mold structure 160 may also be formed on sidewalls of the heat slug 154.

Figure 10:
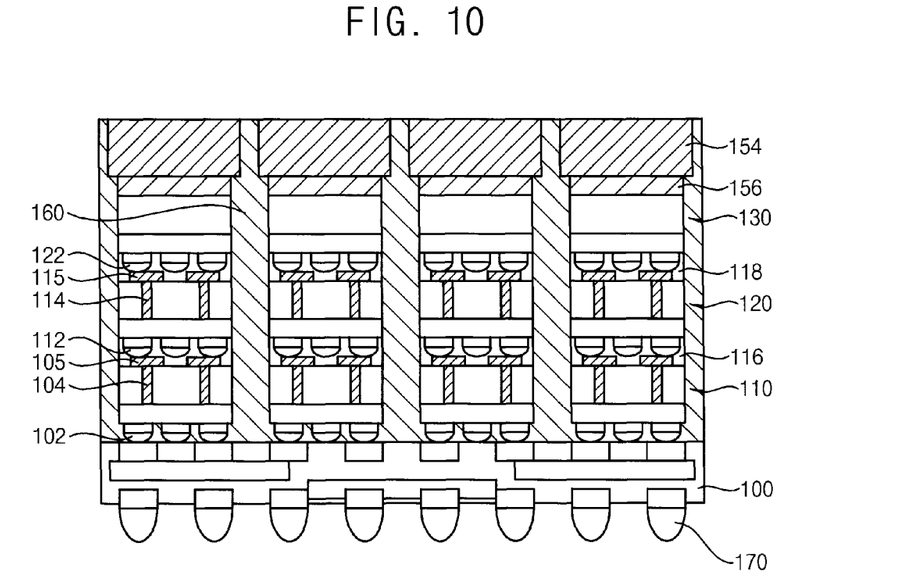

Referring to FIG. 10, connection terminals 170 may be adhered to a lower portion of the circuit substrate 100. The connection terminals 170 may include a solder ball. The above processes may be performed to complete a plurality of semiconductor packages on the circuit substrate 100.

Figure 11:
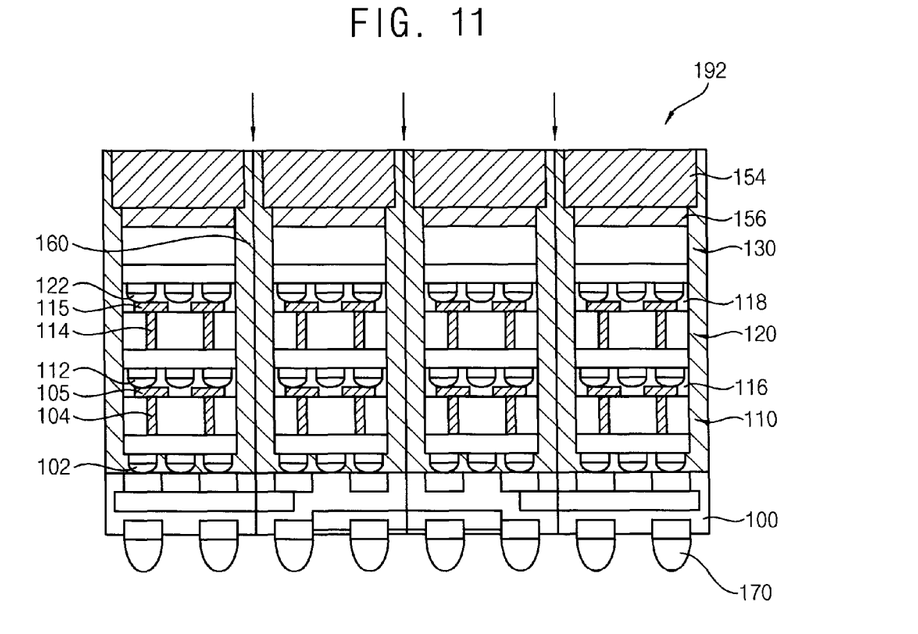

Referring to FIGS. 11 and 1, a sawing process may be performed to dice the resulting structure and form the plurality of the semiconductor packages 192.

As descried above, according to example embodiments, in the process for forming the heat slug 154 on the preliminarily stacked chips, the thermal, pressurized bonding process may be performed to permanently bond the preliminarily stacked semiconductor chips to each other. In the bonding process of the semiconductor chips, overflowing the insulating adhesive patterns 116 and 118 may be reduced. The mold structure 160 may be formed after the heat slug 154 is formed such that the mold structure 160 is formed sidewalls of the heat slug 154 and the heat dissipative adhesive pattern.

Figure 12:
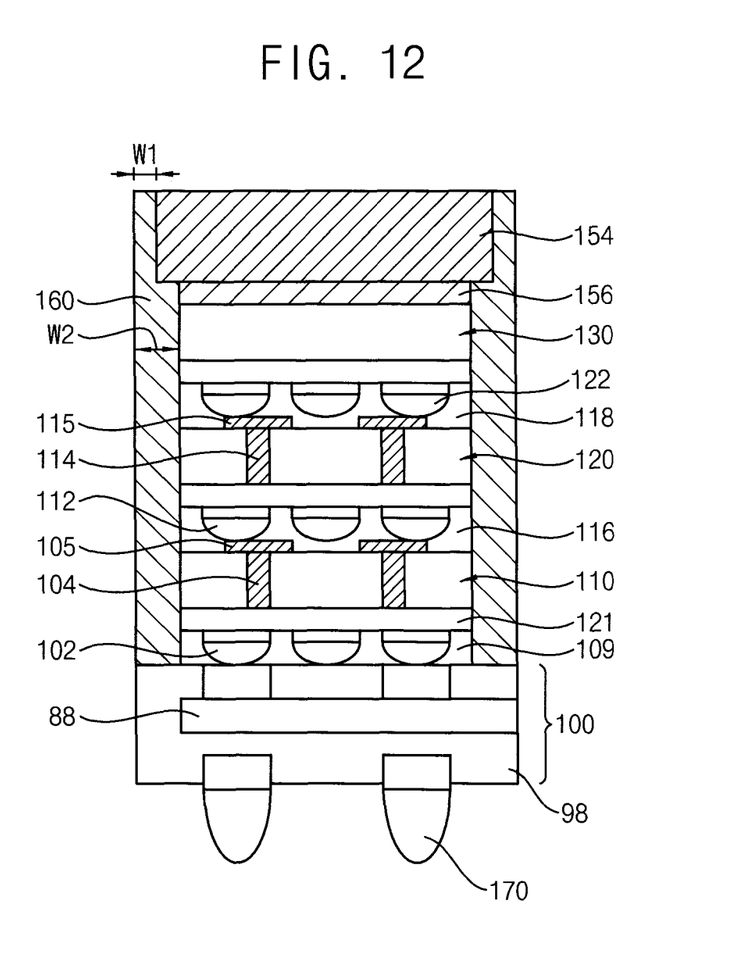
FIG. 12 a cross-sectional view illustrating a semiconductor package in accordance with another embodiment.

In some embodiments, as shown in FIG. 12, another insulating adhesive pattern 109 is used to attach the first semiconductor chip 110 to the circuit substrate 100. In this case, the mold structure 160 does not extend under the first semiconductor chip 110 different from the embodiment shown in FIG. 1.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor package, the method comprising:
stacking semiconductor chips on a circuit substrate by using insulating adhesive patterns to form a plurality of preliminarily stacked chips, each preliminarily stacked chip including the semiconductor chips having the insulating adhesive patterns interposed therebetween;
forming heat slugs on the preliminarily stacked chips by using heat dissipative adhesive patterns, respectively;
thermally pressurizing the heat slugs to bond the underlying semiconductor chips to each other and to form a plurality of stacked chips; and
injecting a mold material between the stacked chips on the circuit substrate to form the mold structure on sidewalls of the semiconductor chips, on sidewalls of the insulating adhesive patterns, on sidewalls of the heat dissipative adhesive patterns, and on sidewalls of the heat slugs.

2. The method of claim 1, wherein forming the preliminarily stacked chips comprises:
i) bonding first semiconductor chips to the circuit substrate by a reflow process;
ii) forming first insulating adhesive patterns on bottom surfaces of second semiconductor chips, respectively; and
iii) aligning the second semiconductor chips with the first semiconductor chips, respectively, and preliminarily bonding the first and second semiconductor chips to each other at a first temperature and under a first pressure.

3. The method of claim 2, further comprising performing the steps of ii) and iii) repeatedly for third to n-th semiconductor chips (where n is an integer equal to or greater than 3).

4. The method of claim 2, wherein the first temperature is less than a melting point of a connection structure included in each semiconductor chip.

5. The method of claim 1, wherein thermally pressurizing the heat slugs is performed at a second temperature greater than the first temperature and under a second pressure greater than the first pressure.

6. The method of claim 5, wherein the second pressure is within a range of about 3 times to about 10 times the first pressure.

7. The method of claim 5, wherein the second temperature is greater than a melting point of a connection member included in the semiconductor chip.

8. The method of claim 1, wherein a top surface area of each heat slug is greater than a top surface area of an uppermost semiconductor chip, and wherein each heat slug covers the uppermost semiconductor chip.

9. The method of claim 1, wherein forming the heat slugs on the preliminarily stacked chips comprises:
forming a heat dissipative plate and a heat dissipative adhesive film on a carrier;
patterning the heat dissipative plate and the heat dissipative adhesive film to form the heat slugs and the heat dissipative adhesive patterns; and
aligning the heat dissipative adhesive patterns with the preliminarily stacked chips, respectively, and thermally pressurizing the heat slugs.

10. The method of claim 1, wherein at least one of the semiconductor chips includes a through silicon via.

11. The method of claim 1, wherein the insulating adhesive pattern includes a different material from that of the heat dissipative adhesive pattern.

12. The method of claim 1, further comprising:
bonding connection terminals to a bottom surface of the circuit substrate including the mold structure; and
dicing the mold structure and the circuit substrate to form separated semiconductor packages.

* * * * *